(12) United States Patent
Szczypinski (10) Patent No.: US 7,549,001 B2
(45) Date of Patent: Jun. 16, 2009

(54) DIGITAL RAM MEMORY CIRCUIT WITH AN EXPANDED COMMAND STRUCTURE

(75) Inventor: Kazimierz Szczypinski, München (DE)

(73) Assignee: Infineon Technologies AG, Munich (DE)

( * ) Notice: Subject to any disclaimer, the term of this patent is extended or adjusted under 35 U.S.C. 154(b) by 389 days.

(21) Appl. No.: 11/178,915

(22) Filed: Jul. 11, 2005

(65) Prior Publication Data

US 2006/0018165 A1    Jan. 26, 2006

(30) Foreign Application Priority Data

Jul. 9, 2004    (DE)    ............ 10 2004 033 387

(51) Int. Cl.
G06F 3/00     (2006.01)
G06F 13/00    (2006.01)
G06F 12/00    (2006.01)

(52) U.S. Cl. .................. 710/71; 710/5; 711/101; 711/104; 711/105; 711/149; 711/154

(58) Field of Classification Search .......... 710/71
See application file for complete search history.

(56) References Cited

U.S. PATENT DOCUMENTS

| | | | | |
|---|---|---|---|---|
| 5,357,621 A | | 10/1994 | Cox | |
| 5,724,554 A | * | 3/1998 | Gish | 710/11 |
| 6,088,755 A | * | 7/2000 | Kobayashi et al. | 710/300 |
| 6,405,280 B1 | * | 6/2002 | Ryan | 711/105 |
| 2001/0008005 A1 | | 7/2001 | Stevens et al. | |
| 2003/0043670 A1 | * | 3/2003 | Niwa et al. | 365/221 |
| 2005/0168470 A1 | * | 8/2005 | Prabhakar et al. | 345/531 |

OTHER PUBLICATIONS

Definition for "command", Academic Press Dictionary of Science and Technology, http://www.xreferplus.com/entry.jsp?xrefid=3088218&secid=.-&hh=1.*
Academic Press, 1992, Definition for "command", Academic Press Dictionary of Science and Technology, http://www.xreferplus.com/entry.jsp?xrefid=3088218&secid=.-&hh=1.*
German Patent Office Examination Report dated Apr. 8, 2005.

* cited by examiner

Primary Examiner—Henry W. H. Tsai
Assistant Examiner—Kris Rhu
(74) Attorney, Agent, or Firm—Patterson & Sheridan, L.L.P.

(57) ABSTRACT

Methods, systems, and articles of manufacture for transferring control commands to a memory device. In one embodiment, the memory device comprises at least one serial command terminal with a downstream serial command decoder for receiving and decoding external command code as a serial bit sequence. Embodiments of the invention also disclose a memory controller comprising both a multiplicity of parallel command outputs and at least one serial command output for transmitting command code to the memory device as a serial bit sequence.

27 Claims, 5 Drawing Sheets

DIGITAL RAM MEMORY CIRCUIT WITH AN EXPANDED COMMAND STRUCTURE

CROSS-REFERENCE TO RELATED APPLICATIONS

This application claims foreign priority benefits under 35 U.S.C. §119 to co-pending German patent application number DE 10 2004 033 387.4, filed 9 Jul. 2004. This related patent application is herein incorporated by reference in its entirety.

BACKGROUND OF THE INVENTION

1. Field of the Invention

The invention relates to a digital memory circuit having a multiplicity of memory cells which can be addressed selectively in order to either write or read memory data from said memory cells. Memory circuits of this generic type are generally referred to by the acronym RAM (Random Access Memory) and are usually manufactured as integrated components on semiconductor chips. The field of the invention is what is referred to as "dynamic" RAM components (DRAMs) as are used as the main memory in computers. The subject matter of the invention is also a memory controller which can be used in conjunction with memory circuits of the above-mentioned generic type.

2. Description of the Related Art

To be able to communicate with other circuits, a RAM component has a plurality of groups of external terminals. These include the data terminals via which the memory data is input and output, and the address terminals at which the information for addressing the memory cells is applied. These also include a separate input with a plurality of terminals for receiving commands for initiating the various operations of the RAM component. In the case of RAM components whose memory cells are organized as a matrix composed of rows and columns and in which a read or write process is started at a row by activating a row selection line (word line) according to a row address, the following commands, inter alia, are customary: "Precharge" for setting all the column selection lines to a specific initial potential; "Activate" for setting a word line which has been addressed according to the row address to an activation potential, as a result of which all the memory cells of the respective row are opened for a possible access for reading or writing; "Read" for initiating a reading process at the memory cells in the activated row which have been selected by means of a column address; "Write" for initiating a writing process at the memory cells in the activated row which have been selected by means of a column address.

In addition to these commands, a multiplicity of other commands are also used in customary RAM components, for example a command "Select Component" (Chip Select) used to address the memory component as a whole, and a command "Set Mode Register" used to set specific operating parameters or operating properties of the component according to a specific setting information item. The setting information item is usually input via the address terminal, while said command is applied at the command input in order to store the setting information in a register. This information may, for example, predefine the length of the bursts of the memory data which is to be written in and read out and, if desired, predefine further parameters, for example specific waiting times within the sequence of specific memory operations. Further commands are "No Operation" for filling out waiting times, "Power Down" for a waiting state with reduced power consumption and, in the case of DRAMs, the commands "Autorefresh" used to bring about automatic refreshing of the data in the memory cells and "Selfrefresh" used to start up the periodic refreshing of the data in operating intervals of the component.

The commands mentioned above are only a few examples and not an exhaustive listing. The contents of the commands and also their diversity depend, of course, on the design of the memory component with the total number of different commands depending on the number of control operations. Since it is desired to keep the number of external terminals at a memory component as small as possible, it would be counterproductive to provide a separate terminal for each command. Separate terminals must, if necessary, be provided for superordinate commands such as, for example, the "Select Component" command, which are intended to maintain an operating feature over a sequence of other commands. These other commands are usually coded as m-bit digital words in parallel formats so that m parallel command terminals are sufficient to be able to distinguish between $2^m$ different commands. A command decoder then decodes each received m-bit command code word, in parallel with the superordinate commands mentioned above, in order to condition an internal memory device for carrying out the operation required by the command.

The reception of the commands in parallel format permits a high working speed of the memory component. Any command can be received and decoded within a single clock period so that the rapid initiation of operations required by a command is possible. This is desirable or necessary for high speed commands such as, for example, "Precharge", "Activate", "Read", "Write", "Autorefresh" and some others. On the other hand, the number of possible commands in the prior art described above is dependent on the number of command terminals. To be more precise, the number of command possibilities is in a fixed relationship with the number of command terminals.

However, a digital RAM memory circuit is flexible in its possibilities of use the greater the variety of command possibilities. Therefore, what is needed is to increase the ratio of the number of command possibilities with respect to the number of command terminals in a RAM memory circuit.

SUMMARY OF THE INVENTION

Accordingly, the invention is implemented in a digital memory circuit having a multiplicity of memory cells, address terminals for applying address information for addressing respectively selected memory cells, data terminals for inputting and outputting the memory data which is to be written into or has been read out at the addressed memory cells, an internal control device which responds to control commands as a function of external command code words in order to initiate operations of the memory circuit, and a plurality of parallel command terminals with a parallel command decoder connected downstream for receiving and for decoding external multibit command code words which are each in parallel format. According to the invention, at least one serial command terminal with a downstream serial command decoder is additionally provided for receiving and decoding external command code words as a serial bit sequence.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only

DETAILED DESCRIPTION OF THE PREFERRED EMBODIMENT

Overview

A memory controller having address outputs for transmitting address information for addressing respectively selected memory cells in a memory circuit is provided. The memory controller has data terminals for transmitting and receiving the memory data which is to be written in, or has been read out, at the addressed memory cells. The memory controller also has a parallel command coder with a multiplicity of parallel command outputs for coding and transmitting multibit command words in parallel format to the memory circuit to initiate operations of the memory circuit. At least one serial command coder with a serial command output is additionally provided for coding and transmitting command code words to the memory circuit, in each case as a serial bit sequence.

The number of different command code words which can be applied to a serial command terminal is theoretically unlimited. In practice, a certain limit can be set if a certain maximum word length (number of bits in the code word) is predefined for the code words. However, basically any desired number of command options at a single serial terminal is possible.

As a result, the number of possible commands and consequently the number of operations which can be controlled individually by means of external commands can be extended considerably beyond the limit which is set by the customary parallel command terminals. Of course, the reception and the decoding of a serial code word last significantly longer than the reception and the decoding of a parallel code word. However, the invention is based on the idea that there are, or may be, useful commands in which a slow reception speed can be readily tolerated. The extension of the command options by means of the serial command terminal can therefore be extended to commands of this type.

Among the commands which are conventionally issued via the parallel command terminals, there are also commands which do not necessarily have to be carried out at a high speed. These include, for example, the commands "Set Mode Register", "Selfrefresh" and "Standardization of the Data Output Drivers". If the serial command terminal is also used for these commands, free capacity for additional high speed commands is also acquired at the parallel command terminals.

Accordingly, in one embodiment of the invention, control inputs of the internal control device of the memory circuit which accept the control commands which are to be executed most quickly are connected to outputs of the command decoder which decodes the command code words which are received at the parallel command terminals. Control inputs of the internal control device which accept control commands which are to be executed more slowly are connected to outputs of the command decoder which decodes the command code words which are received at the serial command terminal.

As already mentioned, there are commands which relate to the setting of operating parameters or operating properties. In such commands, which are referred to below as "combined commands", a "setting" information item must also be input in addition to the "destination" information item. The destination information item specifies the destination of the setting information, i.e., it names the operation which is to be carried out, for example by specifying where the setting information is to be stored or be effective. Thus, for example, the customary command "set mode register" specifies the mode register as a destination, and includes an instruction to store setting information received in conjunction with the command in associated cells of this register. This information is then available in the memory component to configure the internal control device in such a way that during subsequent operation the memory component operates according to the settings stored by the command. As already mentioned, in the prior art, the setting information is applied to the address terminals while the destination information is applied to the parallel command terminals.

Since relatively slow execution can be tolerated in the case of combined commands, there is no disadvantage if these commands are issued via the serial command terminal according to the invention. The content of a command which is input at the serial command terminal can be restricted to the destination information item, while the setting information item, which is possibly necessary, is applied, as in the prior art, via address terminals (or at other terminals which are present and which are not being used in some other way at this moment). In some cases, the setting information item may be input via the address terminals directly after the serially decoded command has been decoded. However, in one embodiment, the serial command terminal may also provide the possibility of inputting the destination information item and the setting information item as a total package in the form of a combined serial code word.

In one particular embodiment of the invention, the "serial" command decoder of the memory circuit, which may be connected downstream of the serial command terminal, is designed to decode code words with a variable length, according to a code tree similar to a Huffman code or a Shannon-Fano code. This has the advantage that the code tree can be expanded in any desired way and the list of commands to be decoded can thus be expanded, without having to change the code words of the existing commands. Furthermore, as is known in the case of Huffman coding, the average code word length, and thus the redundancy, can be minimized by suitably configuring the code tree.

DETAILED DESCRIPTION

Figure 1:
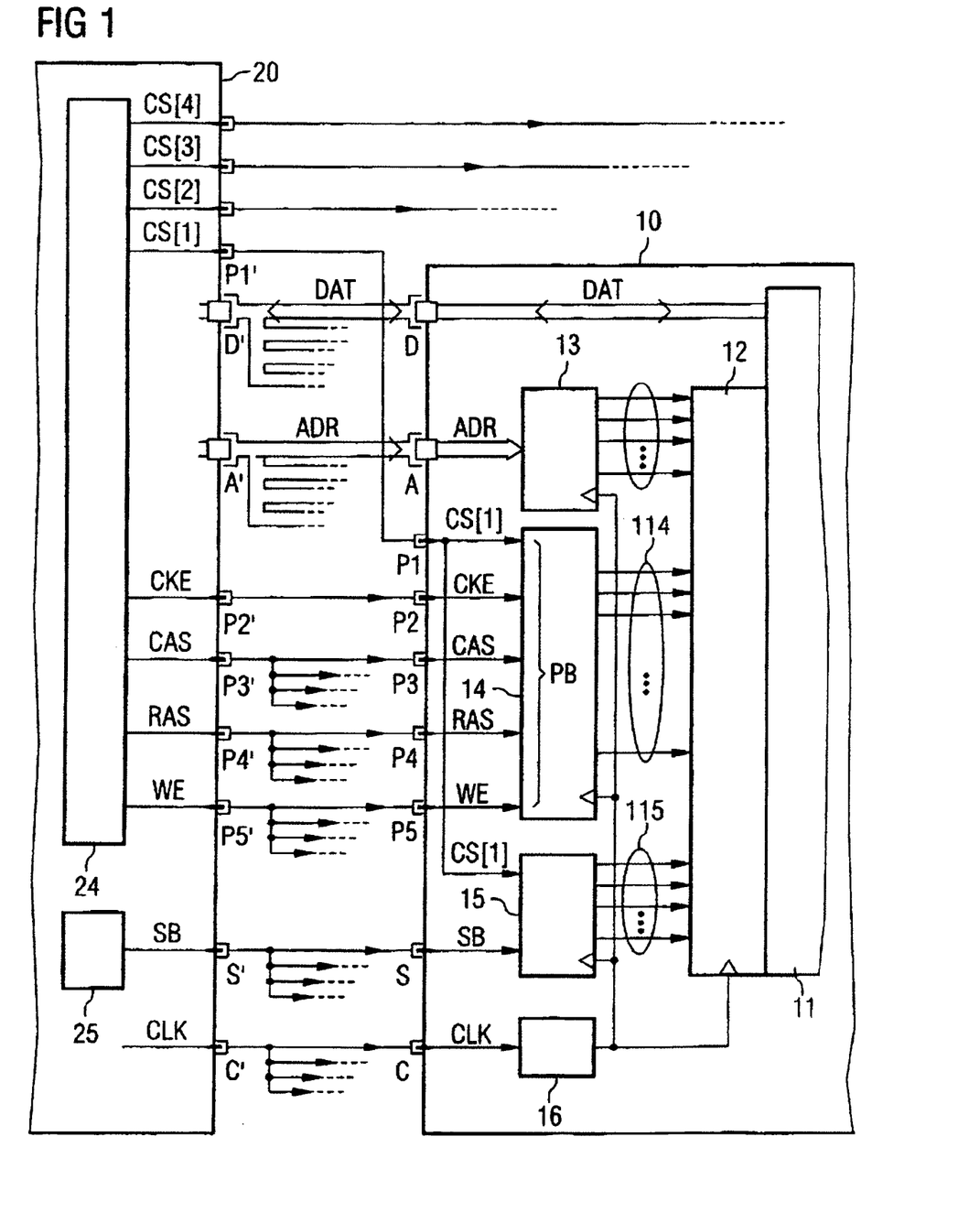
FIG. 1 shows, in a simplified block diagram, the design of a memory circuit with an external memory controller according to one embodiment of the invention.

The memory circuit 10 which is illustrated partially in the right hand part of FIG. 1 (outlined by a bold frame) forms a component which is integrated on a semiconductor chip. The illustrated exemplary embodiment is a DRAM, to be precise a "synchronous" DRAM (SDRAM) whose memory cell array is drawn as a block 11 and may be divided into individual banks. The memory cells are organized as a matrix composed of rows and columns. Selective access to the memory cells is carried out as a function of row address code words and column address code words (ADR) which are each received in parallel format via a multiplicity of external address terminals (address pins) A and decoded in an address decoder device 13, to be precise separately in a row decoder and a column decoder (not illustrated separately). The memory data DAT which is to be written in or read out from the addressed memory cells is input or output in each case as packages (memory data words) in parallel format via a multiplicity of external data terminals (data pins) D. The data is transmitted between the data pins D and the data terminals of the memory cell array 11 via an internal data bus which can branch to the individual banks (not illustrated separately) via multiplexers.

The memory component 10 contains a complicated and highly branched system of control means and switching means in order to set up the connections between the respectively addressed memory cells and the data pins D, to control various operating sequences and operations and to make settings. This system, referred to globally as "internal control device" is illustrated in FIG. 1 as block 12 and responds to external commands which are transmitted by an external memory controller 20, as are the address words ADR and the memory data DAT which is to be written in. This controller 20, which also receives the memory data which has been read out via the data pins D of the component 10 (and passes them on for further processing) is illustrated partially in the left hand part of FIG. 1 and has data terminals D' for the data DAT which is to be transmitted and received and address terminals A' for the address information ADR which is to be transmitted.

At the DRAM memory component 10 illustrated in FIG. 1 there are five external parallel command terminals (parallel command pins) P1, P2, P3, P4 and P5 for receiving commands in the form of five parallel command bits, which are usually referred to by the abbreviations WE, RAS, CAS, CKE and CS. These parallel command bits, referred to here globally by the abbreviation PB, are generated by a parallel command coder 24 in the controller 20 and transmitted via five parallel command terminals P1', P2', P3', P4' and P5' of the controller and fed to a parallel-bit command decoder 14 in the memory component 10 which excites, as a function of the binary pattern of the code word, a respective specific combination of a multiplicity of output-end control lines 114 in order to condition the control device 12 to carry out the parallel-coded command. In this context, the logic value of the command bit CS[1] determines the selection ("select") or deselection ("deselect") of the memory component 10, and the three command bits WE, RAS, CAS permit eight additional command options in the selected state of the memory component (and theoretically also eight command options in the deselected state). The command bit CKE ("clock enable") is reserved for switching on and off operating states in which the component as it were "sleeps"; that is to say it does not exchange any data with the controller and requires only low power.

In practice, a plurality of memory components of the same type are combined to form one memory module. In such a case the system can be configured in such a way that in each case only one specifically selected example of the memory components communicates with the controller 20. In this case, all the lines leaving the controller branch to the various memory components, as indicated by dashed lines in FIG. 1 for the exemplary case of four components. With the exception of the branching points, the line for the CS command bit is for selecting/deselecting the component. As shown, a separate CS output is provided for each component at the controller 20 in order to transmit CS bits CS[1], CS[2], CS[3], CS[4] for the various components independently of one another.

However, the system can also be configured in such a way that all the components of one module communicate simultaneously with a common controller which accordingly has to have a corresponding number of groups of data terminals. In such a case, each of these groups is connected to the data terminals of an individually assigned memory component, while all the other terminals of the controller branch to the memory components. In this case (not illustrated), it is possible to dispense with the transmission of CS command bits. The CS terminals of the memory components can then be permanently connected to the "activating" logic potential. As a result, the number of terminals to be actuated at the memory components is kept lower. Of course, the latter is also possible if only a single memory component is connected to a controller.

All the operating sequences in the memory component 10 and also in the controller 20 are received under clock control on the basis of a reference clock signal CLK which is transmitted from the controller 20 via a terminal C', received in the component 10 via an external clock terminal C and a clock receiver 16 and distributed to the individual circuits via a network of clock lines, in each case with the phase angle which is necessary for synchronization.

In order to extend the command options, the invention provides, at the memory module 10, an additional serial external command terminal (serial command pin) S for receiving commands which can be generated by a serial command coder 25 in the controller 20 as code words SB, in each case in the form of a bit sequence, and can be transmitted via a serial command terminal S' of the controller 20. In order to decode these serially coded commands SB in the memory component 10, a separate "serial" command decoder 15 with a multiplicity of output lines 115 is used. The output lines 115 are excited by the bit pattern of the command words SB. Each of the different serially coded commands SB influence respectively selected circuit elements of the control device 12 in order to carry out the respective command. In the case illustrated in which the memory component 10 is controlled by the same controller 20 as other components of the same type, the serial command decoder 15 also has an input for receiving the "chip select" command bit CS[1] in order to activate this particular decoder only if the specific component 10 is to be addressed.

The serial command decoder 15 is preferably designed to decode code words with a variable length. An example of a code tree according to one embodiment of the invention is shown in the upper part of FIG. 2, and the associated code table is given below it.

Figure 2:
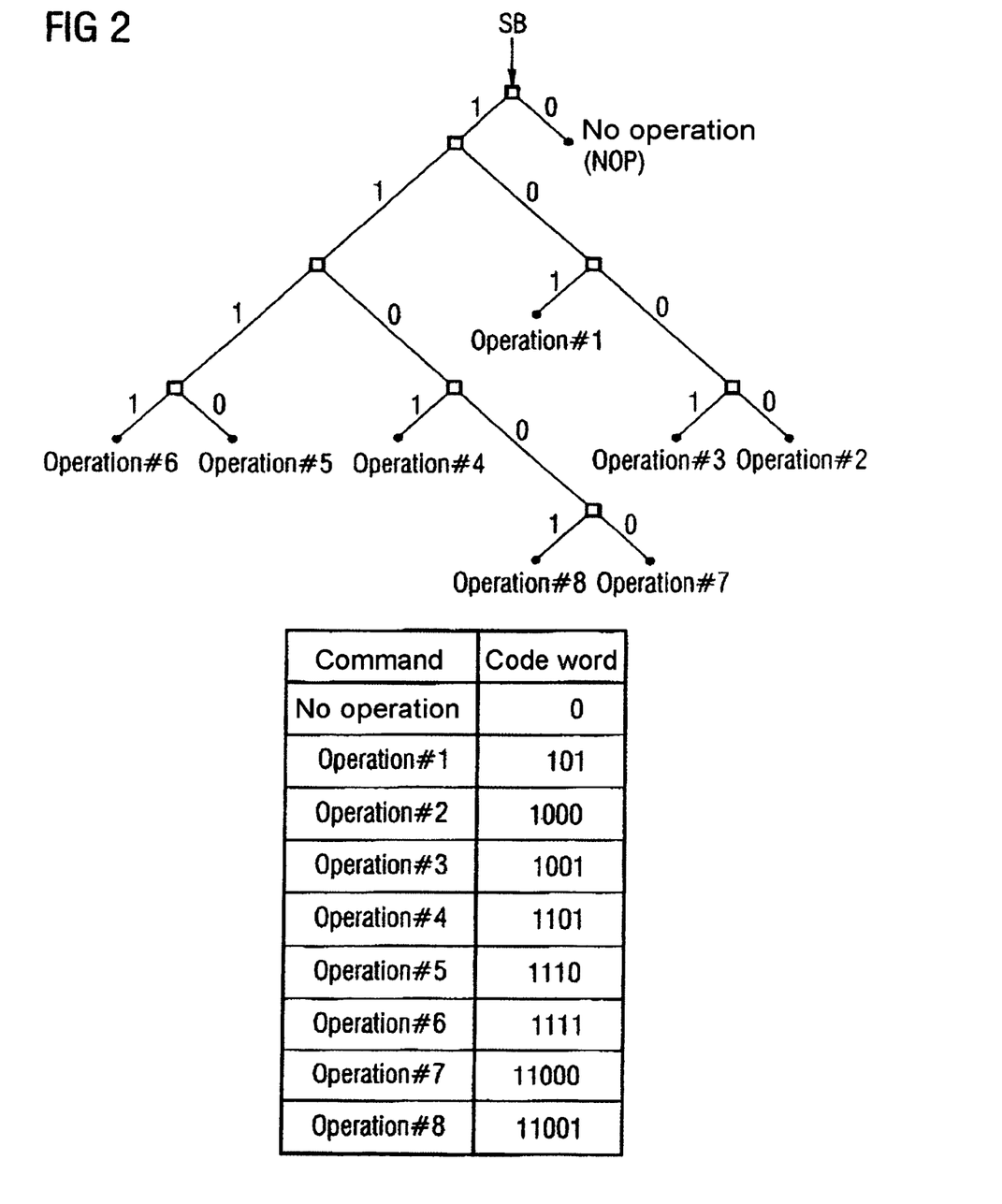
FIG. 2 shows an example of a code tree for serial command code words with a variable length.

For the example shown in FIG. 2 it is assumed that the serial command decoder 15 is to distinguish between nine different commands, specifically eight different commands in order to carry out one of eight operations #1 to #8, and the command "no operation" (abbreviated as "NOP"). For the sake of simplicity, at first the case will be considered in which all the serial commands SB are "basic" commands which each contain only one destination information item and no setting information item, i.e., the serial commands are commands which do not require any additional setting information for them to be carried out or commands whose setting information is transmitted via other terminals (for example selected address terminals).

It is known that a code with a variable length may be used to minimize the redundancy of a sequence of code words by providing different word lengths for each code word. A shorter length is selected for more frequent words than for less common words. A generally known example of this is what is referred to as the Huffman code.

The designer of a Huffman code table conventionally adopts the procedure that the various information items which are to be respectively represented by a code word are examined for their probability of occurrence and the lengths of the various code words are then all dimensioned in such a way that the average code word length is at a minimum. However, in the present case a different criterion than the probability of occurrence is preferably adopted (alone or in addition) for the assignment of a code word to a command. In the present case, the criterion may be how fast the respective command has to be, or is to be, carried out. The shorter the time which may pass from the start of the command to its execution or to the reception of a following command, the shorter the code word which is assigned to the respective command.

The code tree according to FIG. 2 is constructed according to this criterion. The NOP command is necessary because a bit with a serial command input S has to be transmitted with each period of the clock CLK, that is to say even in intervals (no operation) between active commands. Each NOP command should be detected as quickly as possible, at best within a single clock period, so that the decoding of an active command (or an uninterrupted sequence of active commands) can start immediately. Furthermore, the NOP command is the most frequent of all commands and its probability of occurrence is greater than 50%. Accordingly, the NOP command is assigned a code word with just a single bit, in the case shown the 1-bit word "0". Correspondingly, the "0" branch of the first branching point of the code tree ends with NOP and does not have any further branching. On the other hand, the "1" branch of the first branching point, that is to say of the initial "node" branches further to form a total of eight alternative paths which lead to the eight different operations #1 to #8.

In order to decode the serial command bits SB, it is possible to use a Huffman decoder of the conventional type, in which the command code words can follow one another directly without separate interval signals between them (referred to as prefix property). After its initialization or start reset, the decoder interprets successive bits as components of a word until the end of a path is reached in the code tree. The signal for resetting is derived from this so that the bit which then follows is interpreted as a first bit of a new code word.

Because of the forced resetting of a conventional Huffman decoder whenever a valid code word is detected (that is to say after the end of a path is reached), it is not readily possible to extend a code word by means of an additional setting information item. Therefore, if it is desired to subsequently insert a setting information item into a number of selected operation commands it is then necessary to prevent the decoder attempting to decode the setting information item as a new command.

Figure 3:
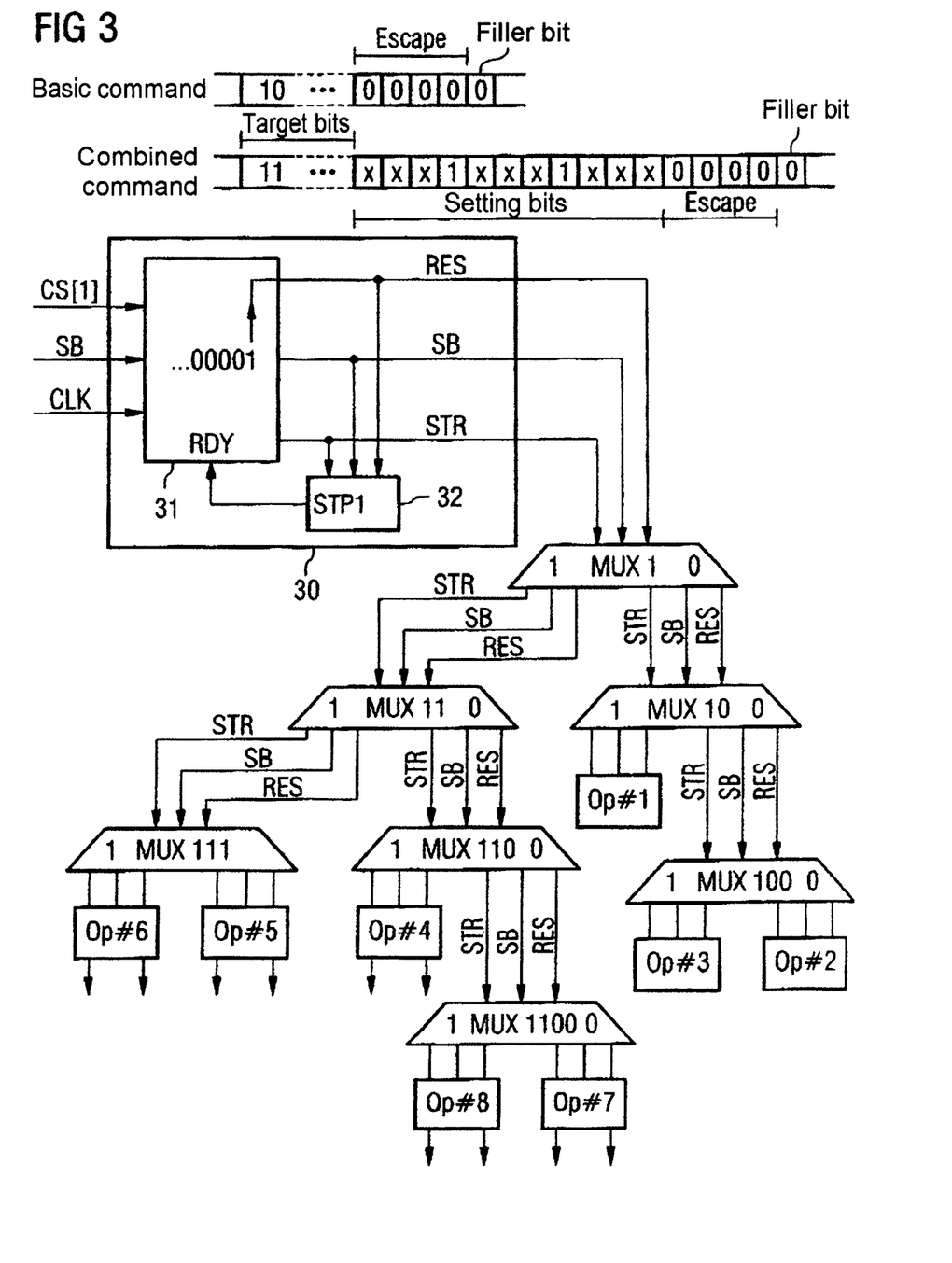
FIG. 3 shows an embodiment of a decoder for the code tree example according to FIG. 2.

FIG. 3 shows an exemplary embodiment of the scheme of a novel decoder which can distinguish serial command code words not only according to the respective destination but also can add an additional setting information item to the actuated destination. The exemplary embodiment shown is conceived specifically for the code tree according to FIG. 2, specifically for the case in which the operations #4, #5, #6, #7 and #8 each require an additional setting information item. That is to say the commands for these operations are "combined" commands which contain a destination information item to be decoded and a setting information item which is then to be fed through to the destination. The commands for the operations #1, #2 and #3 are, on the other hand, "basic" commands which contain only a destination information item and no setting information item.

The decoder according to FIG. 3 contains a reception controller 30 which is kept operating by the chip-select bit CS[1] and receives the sequence of the serial command bits SB together with the clock signal CLK. An input circuit 31 in the reception controller 30 synchronizes the bit sequence SB with the clock signal and supplies the bit sequence SB on a first line in parallel with an accompanying strobe signal STR on a second line and an enable/reset signal RES on a third line. The strobe signal STR contains clock edges which follow one another with the bit rate of the command bit SB in order to synchronize the sampling of the command bits at each successive circuit. For the following description it is assumed that the reset logic value of RES is a logic "1", and that the enable logic value of RES is a logic "0".

The input circuit 31 keeps the signal RES at "1" (reset state) as long as no active command is received. According to the code table shown in FIG. 2, each active command starts with a "1". A "1" which occurs at the SB input in the reset state of the input circuit 31 is to be evaluated as the start of an active command and sets the signal RES to the enable logic value "0".

The active commands received by the decoder according to FIG. 3 can be divided, as stated, into basic commands (that is to say commands without setting information) and combined commands (that is to say commands with setting information). At each combined command, the setting bits follow the destination bit sequence directly after the last bit. These setting bits, which contain the setting information of the command, can of course each have any logic value "x" (0 or 1) and there may be any desired number of them. Since the decoder has to be capable of detecting the end of a command, it would be possible to add a header, which indicates the code word length, to any command irrespective of whether it is a basic command or a combined command. This would be recommended only if the variation width of the word lengths were relatively small so that only a few bits would be necessary for the header.

In the embodiment of the decoder according to FIG. 3, measures are taken in order to be able to detect the end of a command in a different way. For this purpose, there is an escape detector 32 in the reception controller 30. Starting from the enabling of the reception controller (RES=0), the escape detector 32 senses the command bits SB and activates a stop signal STP1 as soon as it detects a specific "escape" symbol in the command bits SB. An exclusive bit pattern is selected as the escape symbol and this pattern must not occur in any of the command code words and can be inserted after the last bit of each command in the command bit sequence. In the case described here, the sequence "0000" is such an exclusive bit pattern and can thus be used as an "escape" symbol. Of course the escape bit sequence 0000 must never occur within a setting bit sequence either. This can be ensured, for example, by inserting "1" bit at suitable locations within the setting bit sequence, as illustrated. Activating the stop signal STP1 in response to the detection of the escape signal causes the input circuit 31 to be reset by means of its control input RDY, and the signal RES is thus changed to "1". It is recommended that a filler bit with the binary value "0" be inserted by the command coder after each escape symbol in order to have sufficient time (one clock period) for resetting the decoder after the escape symbol has been detected. At the upper edge of FIG. 3 it is shown how the commands are combined in accordance with the described pattern.

The actual decoding of the active commands is carried out according to FIG. 3 in a branching tree of signal filters which are arranged in accordance with the branching points of the code tree shown in FIG. 2 and function according to this code tree. The initial branching point of the code tree, that is to say the differentiation between NOP and active commands, has already been implemented by the reception controller 30 which forms, as it were, the main filter leading to the operations which are to be carried out. The filters at the branching points downstream are referred to below according to the general usage as a multiplexer (abbreviated to MUX) even if they are operated only in the demultiplexing direction. The dual number placed at the downstream end designates the respective multiplexer according to its position within the respective decoding path.

The signals which are directed through the multiplexer tree are the three parallel output signals of the input circuit 31, that is to say the enable/reset signal RES, the serial command bits SB and the accompanying strobe signal STR. Each multiplexer has an input with three terminals for receiving these signals, and two inputs, one of which is referred to below as "0 output" (left hand output in FIG. 3) and the other of which is referred to as "1 output" (right hand output in FIG. 3), and each of them has three terminals. Each multiplexer is controlled as a function of the logic value of a bit of the received command bit sequence and of the logic value of the received enable/reset signal RES, according to the rule below:

(a) if RES has the logic value "0", the multiplexer stores the first incoming command bit and transmits all the following command bits SB together with the received signals RES and STR to the 0 output, if and for as long as the stored bit has the logic value "0", and to the 1 output if and for as long as the stored bit has the logic value "1";

(b) the bit stored in the multiplexer is reset to the logic value "0" if RES changes to the logic value "1".

A suitable circuit arrangement for implementing these multiplexer functions will be described below with reference to FIG. 5.

However, at first reference will be made further to FIG. 3. Since the signal RES has been set to "0" with the first destination bit of an active command (which has the logic value "1" according to the invention), depending on its logic value the second destination bit sets the MUX1 to the selection of a 0 output or of a 1 output in order to select the subsequent MUX10 or the subsequent MUX11 to receive the following destination bits. The first bit of these subsequent destination bits (that is to say the third destination bit of the original destination bit sequence) sets the selected MUX10 (or MUX11) to the selection of a 0 output or 1 output, depending on the logic value of said third destination bit. If a selected MUX output is not followed by any further multiplexer, the destination bit sequence is also at an end. The respective output is also the end of the decoder path. When this end output is selected, or immediately afterwards, a clock edge of the strobe signal STR, which of course also passes through the path, appears there for the first time. This clock edge can be used to initiate or carry out the operation identified by the destination bit sequence. This is symbolized in FIG. 3 by an operation block which is connected to the STR line of the output and is referred to by "Op#" and a number placed after it, corresponding to the operation numbering used in FIG. 2.

If the destination bit sequence is associated with a basic command and the last bit of this sequence is followed by the escape symbol "0000", the escape symbol is detected by the escape detector 32. As a result, the signal RES is set to "1" when the last "0" of the escape symbol is sensed in the escape detector. The bits of the escape symbol run until then into the decoder path but they no longer have any effect on the execution of the command. As soon as the first destination bit (logic value "1") of a subsequent active command appears, the cycle described above begins again. The operations activated with basic commands are, in the case of FIG. 1, the operations #1 (destination bit sequence 101), #2 (destination bit sequence 1000) and #3 (destination bit sequence 1001).

If the destination bit sequence is associated with a combined command, the setting bits directly follow the last destination bit. Since in this case there is therefore no escape symbol following the destination bits, and RES does not change to "1" for this reason, the decoder path which is set up is maintained and the setting bits arrive at the respective end output and can be passed on according to the command. For this purpose, operation blocks #4 (destination bit sequence 1101), #5 (destination bit sequence 1110), #6 (destination bit sequence 1111), #7 (destination bit sequence 11000) and #4 (destination bit sequence 11001) are embodied in such a way that as soon as the last destination bit has selected the assigned multiplexer output they are placed in a transmission state by the first strobe signal edge appearing there, in which state they pass on the subsequent command bits SB as setting bits to their destination, together with the strobe signal STR. If the escape signal has passed into the decoder after the last setting bit, the escape detector 32 ensures that RES is switched to "1". Although the bits of the escape symbol still run into the decoder path until then, this no longer changes anything in terms of the information content of the setting bit sequence which is already terminated. It is sufficient if the length of the setting bit sequence is respectively known beforehand at the respective destination so that the bits of the escape symbol which run on afterwards can be ignored there. In all cases the transmission state of the respective operation block is terminated as soon as the "1" level of the signal RES has arrived at the last multiplexer of the respective decoder path.

The insertion of the escape symbol, composed of a plurality of bits, after each active command of course reduces the speed with which the commands can follow one another. In order to increase this speed (maximum average command rate), it would be possible to use a shorter escape signal. However, this would further restrict the coding possibilities for the active commands because no code word may contain the bit pattern of the escape signal. For this reason, the shorter the escape signal the more "forbidden" command code words there are. So that a high number of "permitted" code combinations (and thus a high number of the possible commands) can nevertheless be obtained, the average code word length would have to be increased, which would in turn lead to a reduction in the maximum average command rate.

Figure 4:
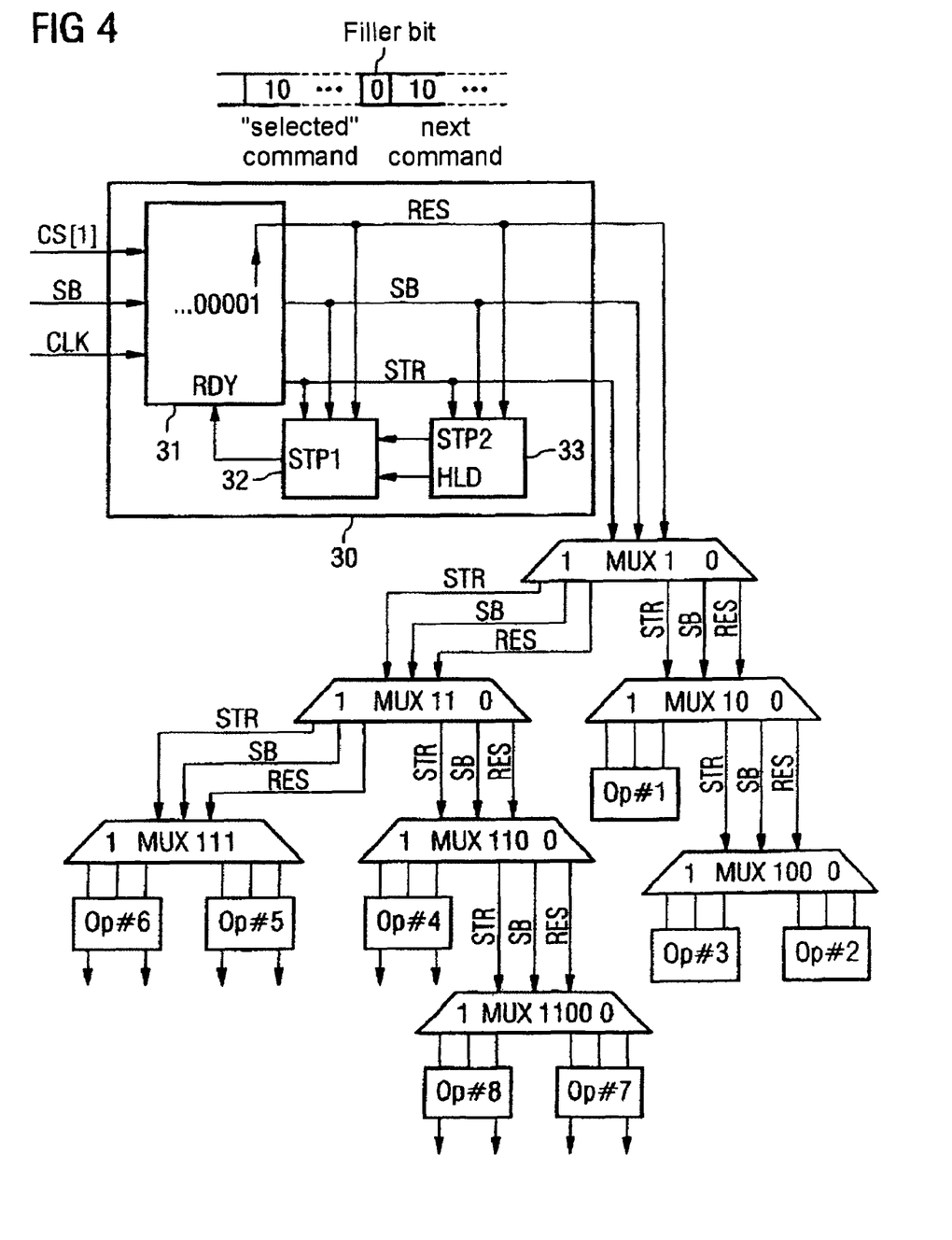
FIG. 4 shows an advantageous modification of the decoder illustrated in FIG. 3.

In one particular embodiment of the invention which is shown in FIG. 4, the serial command decoder is embodied in such a way that it can decode serial commands which follow one another without an intermediate multibit escape signal. The decoder shown in FIG. 4 differs from the embodiment according to FIG. 3 only in that a command discriminator 33 is additionally provided in the reception controller 30. This command discriminator 33 contains a list of selected command code words whose end is to be detected directly when its last bit appears without an escape signal being necessary for this. The command discriminator 33 receives, like the escape detector 32, the enable/reset signal RES, the command bit sequence SB and the strobe signal STR from the input circuit 31, and it senses and compares the received command bits with the stored list of selected command code words. As long as the sensed bit sequence, which appears as soon as the reception controller (RES=0) is enabled, continues in accordance with any of these listed code words, the command discriminator 33 keeps a stop signal STP2 in the inactive state and a hold signal HLD in the active state, as a result of which the escape detector 32 in the reception controller 30 is kept inactive. This means that as long as HLD is active, the stop signal STP1 of the escape detector 32 for the input circuit 31 remains inactive.

As soon as the progressive bit sequence is in accordance with a listed, entire code word, the command discriminator 33 "knows" that the bit sequence which has appeared is one of the "selected" commands whose last bit has just been filled. In this case, the command discriminator 33 activates a stop signal STP2. The active stop signal STP2 is "passed through" to the STP1 output of the escape detector. The effect of this is that the input circuit 31 is reset by means of its control input RDY and the signal RES thus goes to "1", as if the last bit of an escape sequence had been sensed. The first subsequent "1" in the command bit sequence is thus detected again as a start of a new active command.

If, on the other hand, the command discriminator 33 determines, during the sensing of the command bit, that the progressive bit sequence no longer follows any of the listed code words, that is to say is not part of the set of selected commands, it "knows" that the command code word which has started will not constitute any of the selected commands but rather a command whose end has to be detected elsewhere. For this purpose, the command discriminator 33 transfers the function of continuing to observe the command bit sequence to the escape detector 32 by deactivating its output signal HLF. As a result, the escape detector 32 is activated and itself assumes the control of the input circuit 31, precisely as described above in conjunction with FIG. 3, by activating the stop signal STP1, and thus the resetting of the signal RES to "1" only when it has detected the escape signal "0000" in the command bit sequence SB.

The decoding of the commands, that is to say the setting up of the respective decoding path in the code tree, takes place in all cases precisely in the same way as was described with respect to FIG. 3.

The combination of the escape detector 32 with the command discriminator 33 according to FIG. 4 therefore forms a command-end detector which permits a serial command coder quickly to allow a further command code word to follow selected command code words without inserting an escape signal. However, it is also recommended here that in each case a filler bit with the binary value "0" be inserted by the command coder in order to have sufficient time (one clock period) for resetting the decoder after the command discriminator 33 has detected the end of a selected command code word. At the upper edge of FIG. 4 it is shown how two commands follow one another according to the described pattern.

The selected command code words listed in the command discriminator 33 should only be basic commands. The more commands are selected for this, and the more frequently the selected commands are transmitted, the shorter the average bit rate becomes. On the other hand, the memory requirement for the list in the command discriminator 33 with the number and with the length of the listed code words increases. It may therefore be advantageous to record only short and/or frequently occurring command code words in the list of the "selected commands".

An example of the way in which the multiplexers MUX shown in FIG. 3 and FIG. 4 are implemented in terms of circuitry is described below with reference to FIG. 5. In the upper part of FIG. 5 a circuit diagram of a multiplexer is illustrated, and in the lower part of the figure there is a time diagram explaining the method of operation of the illustrated circuit.

Figure 5:
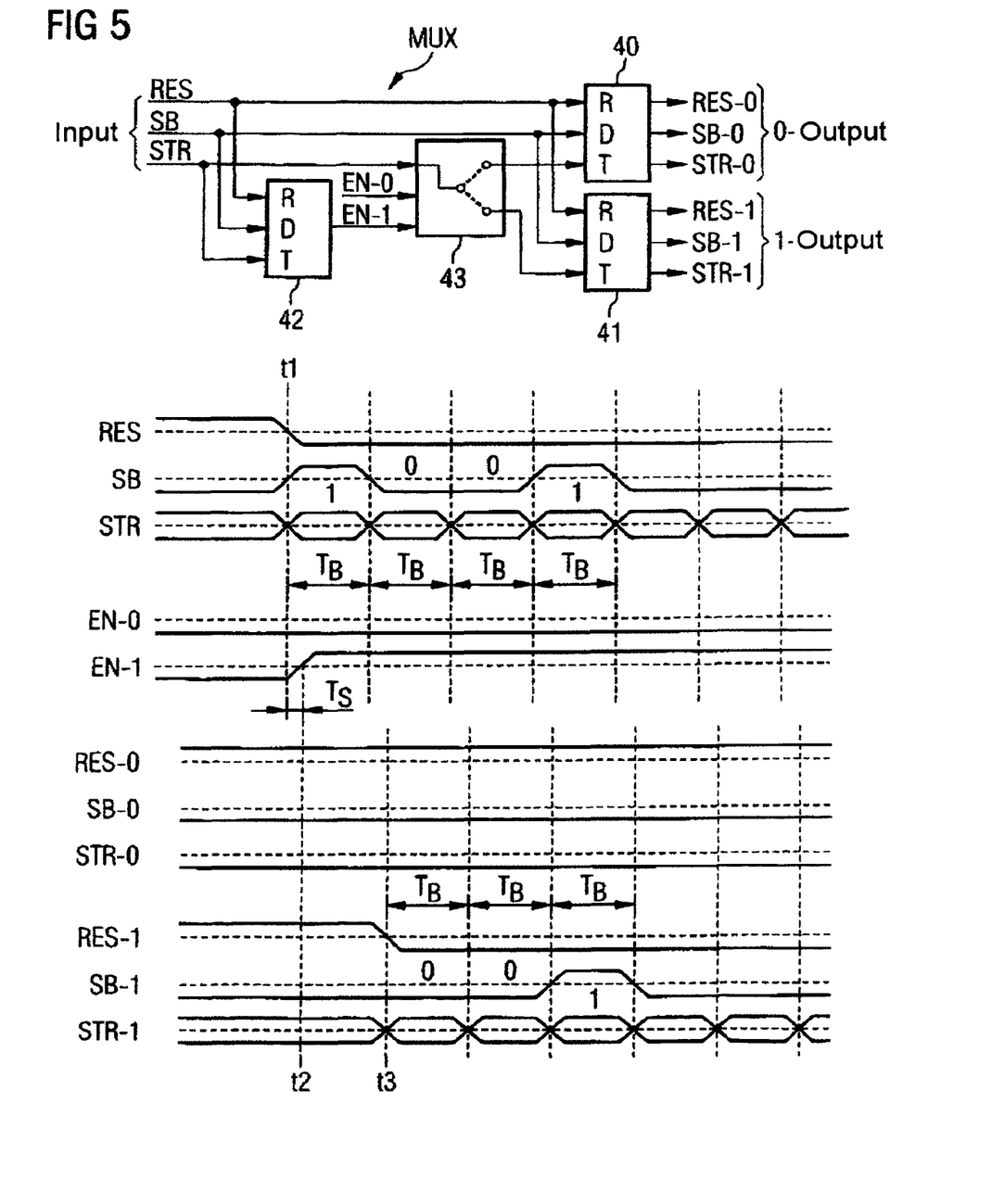
FIG. 5 shows an advantageous embodiment of a branching separating filter for the decoder according to FIG. 3 or FIG. 4.

The multiplexer MUX according to FIG. 5 has three input terminals for receiving the enable/reset signal RES, the serial command bits SB and the strobe signal STR. A register circuit 42 contained in the multiplexer MUX has a data input D which is connected in order to receive the input-end command bits SB, a resetting input R which is connected in order to receive the input-end signal RES, and a clock input T which is connected in order to receive the input-end strobe signal STR. The register circuit 42 is in the reset state if its R input receives a logic "1". In this state, the two outputs EN-0 and EN-1 of the register circuit 42 are at the logic value "0".

The edges of the strobe signal STR give the clock for the transmission of the command bits. In the exemplary embodiment illustrated here, to which the invention is, however, not restricted, both edges of the strobe signal (that is to say the rising and the falling edges) are "clock-active". The frequency of the strobe signal wave is therefore equal to half the bit rate $1/T_B$ of the command bits (where $T_B$ is the bit length). In other words, the command bit rate $1/T_B$ is twice as high as the frequency of the strobe signal wave. Where the command bit rate is twice as high as the frequency of the strobe signal wave, the memory is referred to as "double data rate" (abbreviated as DDR).

In the diagram in FIG. 5, the strobe signal STR is shown in the form which is customary for DDR operation. The strobe edges are aligned with bit boundaries of the serial command bits SB. In order to sample a bit, the strobe edge is delayed within the sampling circuit by the setup time $T_S$ so that it does not activate the sampling of the respective bit until the logic value of the bit has experienced transient recovery. The setting of the setup time $T_S$ has direct influence on the delay of the multiplexer. If the individual successive multiplexers are right next to each other a shorter setup time is selected. If the distances are relatively large, a relatively long setup time is selected in order to increase the operational reliability.

The multiplexer MUX according to FIG. 5 has a first output circuit 40 for the 0 output of the multiplexer, and a second output circuit 41 for the 1 output of the multiplexer. Each of these output circuits 40, 41 has a resetting input R which is connected to the RES input terminal of the multiplexer MUX, and a data input D which is connected to the SB input terminal (command bit input terminal) of the multiplexer MUX, and a clock control input T. The output circuits 40 and 41 each have three output terminals RES-0, SB-0, STR-0 and RES-1, SB-1, STR-1, respectively. The strobe signals for the outputs are preferably generated freshly for each output in situ, for example by means of a fed back inverting register (not illustrated) so that the continuity of the edges is ensured.

The further details of the multiplexer MUX according to FIG. 5 will be described below with reference to its method of operation, specifically with reference to the exemplary case in which the sequence of the destination bits arriving at the input is the sequence "1001". At the same time as the first destination bit "1" arrives at the time t1, RES changes from "1" (high level in the diagram in FIG. 5) to "0" (low level) so that this destination bit is clocked into the register circuit 42 by means of the assigned strobe edge, and the output EN-1 changes to "1" while the output EN-0 remains at "0". The register circuit 42 is designed in such a way that it locks itself in this "1 state" as long as RES remains at "0". The changeover of the output EN-1 from "0" to "1" takes place delayed by $T_S$, that is to say at a time $t2=t1+T_S$, and sets a strobe signal filter 43 in such a way that it applies the input-end strobe signal STR delayed by $T_S$ to the clock input T of the 1 output circuit 41. The effect of this is that starting from the time $t3=t1+T_S+T_B$ the reset signal RES is transmitted to the output terminal RES-1, the second and the following destination bits, that is to say the residual sequence 001, is transmitted to the output terminal SB-1, and the strobe signal wave is transmitted to the output terminal STR-1. The output terminals of the other output circuit 40 remain in the reset (inactive) state: RES-0 remains at "1", SB-0 remains continuously at "0" and STR-0 remains continuously at "0".

If the command bit arriving first is a "0", the register circuit 42 locks itself in the 0 state, as a result of which EN-0 goes to "1" and EN-1 goes to "0" so that, from the time $t3=t1+T_S+T_B$ onwards, the reset signal RES is transmitted to the output terminal RES-0, the second and the following destination bits are transmitted to the output terminal SB-0, and the strobe signal wave is transmitted to the output terminal STR-0. The output terminals of the 1 output circuit 41 remain in the reset (inactive) state: RES-1 remains at "1", SB-1 remains continuously at "0" and STR-1 likewise remains continuously at "0".

The multiplexer MUX shown in FIG. 5 therefore operates according to the rule which was formulated above in (a) and (b). All the multiplexers of the decoder tree are of the same design so that a multiplexer which is assigned downstream of the respectively active output of a multiplexer only receives the respectively remaining residual bits of the destination bit sequence and opens that output of its outputs which is determined by the logic value of the first bit of this residual sequence. As a result, the destination bit sequence continuously becomes one bit shorter from one branching point to the next within the tree until the end of the path is reached with the last destination bit.

The signal RES is fed through the decoding path with precisely the same timing as the command bits SB with the edges of the strobe signal STR, with the same delays. As soon as RES is switched again to "1", the same initial conditions as before the time t1 are respectively established in an incremental fashion at the successive multiplexers. Owing to this pipeline operating mode, the delay with which the command bits reach the end of the decoding path is irrelevant, and it is not necessary to delay the generation of the signal RES (and the inputting of a then following command code word) at the input of the multiplexer tree until the command bits have reached the end of the decoder path.

The embodiments of the serial command decoder and its components which are described above with reference to FIGS. 2 to 4 are only examples, as are the embodiments of its reception controller 30 and its "filter" circuit (multiplexers). Of course, modifications or alternative embodiments are possible without departing from the idea of the invention. A number of examples of possible variants are described below.

The command decoder can, if desired, be restricted to the reception of basic commands (only destination information items); possible setting information items then have to be input via other pins (for example via address pins as is known per se). In particular in this case, the list which is stored in the command discriminator 33 may contain all the commands as "selected commands" so that an escape signal is never necessary and accordingly the escape decoder 32 can be entirely dispensed with. The generation of an HLD signal by the command discriminator 33 is then superfluous, and the SPT2 output of the command discriminator 33 can be connected directly to the RDY input of the input circuit 31.

It is also possible to embody one or more decoding paths in such a way that they transmit commands whose bits are received with a rate which is lower by an integral divisor q than the clock frequency CLK. Such "slowed down" commands are necessary if very slowly operating circuits are to be addressed, for example test mode circuits which are not configured for high frequencies. In order to embody one or more decoding paths correspondingly, a simple 1/q frequency divider, which passes on only every q-th bit, can be connected downstream of an output of a multiplexer. The following branches of the tree then operate with 1/q of the clock frequency CLK.

As already indicated, the use of command codes with variable lengths permits theoretically unlimited extension of the command set without having to change the existing command structure. In order to facilitate the extension, one output at one or respectively more multiplexers can provisionally be left unoccupied in the tree of the decoder in order to be able to connect further branching points for decoding commands which are new (and corresponding commands which are to be coded) there when necessary. An alternative would be to provide the decoder tree a priori with more branching points than are necessary for decoding currently required commands. This results in, as it were "space markers" for commands which are to be newly introduced.

Parts of the serial command decoder can also be integrated into the block 12 of the internal control device of the memory component (FIG. 1), for example the operation blocks Op#1-8 shown in FIG. 3 and, if desired, also some or all of the multiplexers shown in FIG. 3.

As an alternative to codes with a variable length it is also possible to use codes with a fixed length for the serial command code words SB, in particular if only basic commands or only combined commands are to be decoded. There is then never any need for an escape symbol because the end of each command can be detected by counting the bits. In the case of combined commands, the differentiation between destination information and setting information can be effected in terms of the position of the respective bits within the combined code word. However, in such a case certain restrictions have to be accepted on the word length and thus on the diversity of possible operations and possible setting information items.

In addition it is to be noted that the memory component can also have more than just one serial command terminal, in which case each of these terminals would have to be assigned a separate serial command decoder.

Finally it is to be noted that a memory controller must, of course, be designed in such a way that it transmits the serial commands in a form which is understood by the serial command decoder of the memory component. In other words, the serial commands may be transmitted in a way that can be unambiguously decoded. In many cases it may, however, be expedient to select the coding of the serial commands as a function of criteria which are important for the memory controller. In such cases it may be up to the designer of the memory controller to predefine a coding system which is favorable for said controller and the designer of the memory component then has to use this coding system as the basis for his work. The subject matter of the invention is consequently also a memory controller which is designed in such a way that it can transmit not only parallel-coded commands but also serial commands with any type of coding.

While the foregoing is directed to embodiments of the present invention, other and further embodiments of the invention may be devised without departing from the basic scope thereof, and the scope thereof is determined by the claims that follow.

What is claimed is:

1. A method of receiving commands in a memory device, the method comprising:
   receiving, from a memory controller, one or more first commands in parallel across a parallel interface of the memory device;
   decoding the one or more first commands with a first decoder;
   applying the decoded one or more first commands to a control circuit of the memory device;
   receiving, from the memory controller, one or more second commands serially across a serial interface of the memory device, the one or more second commands being a sequence of serial command bits;
   serially decoding the one or more sequences of serial command bits with a second decoder; and
   applying the decoded one or more second commands to the control circuit of the memory device.

2. The method of claim 1, further comprising:
   receiving data information corresponding to at least one of the one or more second commands across the parallel interface of the memory device; and applying the data information to the control circuit.

3. The method of claim 2, wherein the data information is received after receiving the at least one of the one or more second commands.

4. The method of claim 1, wherein the received one or more second commands have a plurality of different lengths.

5. The method of claim 4, wherein the one or more second commands comprises a plurality of commands received in succession with no more than one bit placed between each successive command.

6. The method of claim 1, wherein each of the received one or more second commands is encoded with one of a Huffman-type encoding and a Shannon-Fano encoding.

7. A memory device, comprising:
   memory control circuitry;
   a parallel interface configured to receive one or more first commands in parallel from a memory controller;
   a parallel interface command decoder configured to:
      receive the one or more first commands from the parallel interface;
      decode the one or more first commands; and
      apply the decoded one or more first commands to the memory control circuitry;
   a serial interface configured to receive one or more second commands serially from the memory controller, the one or more second commands being a sequence of serial command bits; and
   a serial interface command decoder configured to:
      receive the one or more sequences of serial command bits from the serial interface;
      serially decode the one or more second commands; and
      apply the decoded one or more second commands to the memory control circuitry.

8. The memory device of claim 7, wherein the parallel interface is further configured to:
   receive data information corresponding to at least one of the one or more second commands, wherein the data information is applied to the memory control circuitry and used to perform the at least one of the one or more second commands.

9. The memory device of claim 7, wherein the one or more second commands have a plurality of different lengths and wherein the one or more second commands comprises a plurality of commands received in succession with no more than one bit placed between each successive command.

10. The memory device of claim 7, wherein each of the received one or more second commands are encoded with one of a Huffman-type encoding and a Shannon-Fano encoding.

11. The memory device of claim 7, wherein at least one of the one or more second commands has a header portion, wherein the header portion specifies a number of data bits corresponding to the at least one of the one or more second commands, and wherein the serial interface is further configured to:
   receive one or more command bits of the at least one of the one or more second commands; and
   immediately after receiving the one or more commands bits of the one or more second commands, receive the specified number of data bits, wherein the specified number of data bits are not decoded by the second decoder.

12. The memory device of claim 7, wherein the serial interface command decoder is further configured to:
   receive an escape sequence of bits after each of the one or more second commands, wherein the escape sequence of bits is the same for each of the one or more second commands, and wherein the escape sequence of bits is not contained within the bits of any of the one or more second commands.

13. A computer system, comprising:
   a memory device, the memory device comprising:
      a first parallel interface configured to receive command bits;
      a parallel interface command decoder configured to:
         receive one or more first commands from the first parallel interface;
         decode the one or more first commands; and
         apply the decoded one or more first commands to the memory control circuitry;
      a first serial interface configured to receive command bits;
      a serial interface command decoder configured to:
         receive one or more second commands from the first serial interface, the one or more second commands being a sequence of serial command bits;
         serially decode the one or more sequences of serial command bits; and
         apply the decoded one or more second commands to the memory control circuitry; and
      a second parallel interface configured to receive address bits; and a memory controller, the memory controller comprising:
      a third parallel interface coupled to the first parallel interface configured to send the one or more first commands in parallel to the first parallel interface;
      a second serial interface coupled to the first serial interface configured to send the one or more second commands serially to the first serial interface; and
      a fourth parallel interface coupled with the second parallel interface configured to send a plurality of address bits in parallel to the second parallel interface.

14. The computer system of claim 13, wherein the memory controller is configured to:
   transmit data information corresponding to at least one of the one or more second commands, wherein the data information is transmitted across the third parallel interface.

15. The computer system of claim 13, wherein the one or more second commands have a plurality of different lengths and wherein the one or more second commands comprises a plurality of commands received in succession with no more than one bit placed between each successive command.

16. The computer system of claim 13, wherein each of the one or more second commands is encoded with one of a Huffman-type encoding and a Shannon-Fano encoding.

17. The computer system of claim 13, wherein at least one of the one or more second commands has a header portion, wherein the header portion specifies a number of data bits corresponding to the at least one of the one or more second commands, and wherein the memory controller is configured to:
   transmit the one or more command bits of the at least one of the one or more second commands; and
   immediately after transmitting the one or more commands bits of the one or more second commands, transmit the specified number of data bits, wherein the specified number of data bits are not decoded by the serial interface command decoder.

18. The computer system of claim 13, wherein at least one of the one or more second commands is a mode register set command.

19. A memory device comprising:
control circuitry;
a parallel command interface configured to receive one or more first commands in parallel;
a parallel address interface;
a parallel command decoder configured to decode the one or more first commands;
a serial interface, the serial interface configured to serially receive one or more second commands, wherein the one or more second commands each comprise a stream of serial bits; and
a serial command decoder, the serial command decoder comprising:
  a sequence detecting circuit, configured to:
    serially detect at least one sequence of bits;
    upon detecting the at least one sequence of bits, issue a reset signal;
  a first multiplexer circuit configured to:
    receive a first stream of serial bits corresponding to one of the one or more second commands;
    based on a first bit of the first stream of serial bits, serially transmit subsequent bits of the stream of serial bits to one of two multiplexer circuits, wherein the subsequent bits of the stream of serial bits are transmitted to the one of the two multiplexer circuits until the reset signal is received;
  a plurality of multiplexer circuits, comprising at least the two multiplexer circuits; and
  command issuing circuitry, wherein the command issuing circuitry receives a command issue signal from one of the plurality of multiplexer circuits, wherein the command issuing circuitry issues a command to the control circuitry corresponding to the one of the one or more second commands.

20. The memory device of claim 19, wherein the at least one sequence of bits is an escape sequence, wherein the escape sequence is not contained in any of the one or more second commands, and wherein the escape sequence is received immediately after each of the one or more second commands.

21. The memory device of claim 19, wherein the at least one sequence of bits comprises one of the one or more second commands.

22. The memory device of claim 19, wherein the parallel address interface is configured to:
receive data information corresponding to at least one of the one or more second commands, wherein the data information is applied to the control circuitry and used to perform the at least one of the one or more second commands.

23. An apparatus, comprising:
a memory controller, comprising:
  a first parallel interface configured to communicate with a corresponding second parallel interface of a memory device, the first parallel interface being configured to send a first set of commands in parallel to the corresponding second parallel interface of the memory device;
  a serial interface configured to communicate with a corresponding serial interface of the memory device; the serial interface being configured to send a second set of commands serially to the corresponding serial interface of the memory device, each command in the second set of commands being a sequence of serial command bits; wherein the first and second sets of commands are selected for parallel and serial transmission, respectively, based on a desired relative speed of execution of the respective commands; and
  a third parallel interface configured to communicate with a corresponding fourth parallel interface of the memory device, the third parallel interface being configured to send a plurality of address bits in parallel to the corresponding fourth parallel interface of the memory device.

24. The apparatus of claim 23, further comprising a memory device, comprising:
memory control circuitry;
the corresponding second parallel interface;
a parallel interface command decoder configured to:
  receive the one or more first commands from the corresponding parallel interface;
  decode the one or more first commands; and
  apply the decoded one or more first commands to the memory control circuitry;
the corresponding serial interface;
a serial interface command decoder configured to:
  receive the one or more second commands from the corresponding serial interface, the one or more second commands being a sequence of serial command bits;
  serially decode the one or more sequences of serial command bits; and
  apply the decoded one or more second commands to the memory control circuitry; and
the corresponding fourth parallel interface.

25. A memory device, comprising:
means for controlling the memory device;
first means for receiving configured to receive one or more first commands in parallel;
first means for decoding configured to:
  receive the one or more first commands from the first means for receiving;
  decode the one or more first commands; and
  apply the decoded one or more first commands to the means for controlling the memory device;
second means for receiving configured to receive one or more second commands serially, the one or more second commands being a sequence of serial command bits;
second means for decoding configured to:
  receive the one or more second commands from the second means for receiving;
  serially decode the one or more sequences of serial command bits; and
  apply the decoded one or more second commands to the means for controlling the memory device; and
a third means for receiving a plurality of address bits in parallel.

26. The memory device of claim 25, wherein the first means for receiving is further configured to:
receive data information corresponding to at least one of the one or more second commands, wherein the data information is applied to the means for controlling the memory device and used to perform the at least one of the one or more second commands.

27. The memory device of claim 25, wherein the one or more second commands have a plurality of different lengths and wherein the one or more second commands comprises a plurality of commands received in succession with no more than one bit placed between each successive command.

* * * * *